United States Patent [19]
Tennant

[11] Patent Number: 5,304,437
[45] Date of Patent: Apr. 19, 1994

[54] MASK FOR X-RAY PATTERN DELINEATION

[75] Inventor: Donald M. Tennant, Freehold, N.J.

[73] Assignee: AT&T Bell Laboratories, Murray Hill, N.J.

[21] Appl. No.: 862,684

[22] Filed: Apr. 3, 1992

[51] Int. Cl.$^5$ .............................. G03F 9/00
[52] U.S. Cl. ........................ 430/5; 430/321; 430/324; 378/34; 378/35
[58] Field of Search ............ 430/5, 22, 269, 321, 430/324, 396; 378/34, 35

[56] References Cited

U.S. PATENT DOCUMENTS

| | | | |
|---|---|---|---|
| 4,906,326 | 3/1990 | Amemiya et al. | 430/296 |
| 5,052,033 | 9/1991 | Ikeda et al. | 378/35 |

OTHER PUBLICATIONS

L. R. Harriott and M. J. Vasile, "Focused beam induced deposition of opaque carbon films," *J. Vac. Sci. Technology*, B6 (3), pp. 1035-1038.
L. R. Harriott, "The technology of finely focused ion beams," *Nuclear Instruments and Methods in Physics Research*, B55, pp. 802-810 (1991).
W. Silfast and O. Wood, "Tenth micron lithography with a 10 Hz 37.2 sodium laser," *Microelectronics Engineering*, 8, pp. 3-11 (1988).
C. M. Melliar-Smith and C. J. Mogab, "Plasma-Assisted Etching Techniques for Pattern Delineation," Academic Press, Inc., V-2, pp. 497-510 (1978).
A. M. Hawryluk, et al., "Reflection mask technology for x-ray projection lithography," *J. Vac. Sci. Technol.* B7 (6), pp. 1702-1704.
Troy W. Barbee, Jr., "Multilayers for x-ray optics," *SPIE, Applications of Thin-Film Multilayered Structures to Figured X-Ray Optics* (1985).
A. Hawryluk and L. Seppala, "Soft x-ray projection lithography using an x-ray reduction camera," *J. Vac. Sci. Technol.* B6 (6), pp. 2162-2166 (1988).
A. Wagner and J. P. Levin, "Focused Ion Beam Repair of Lithographic Masks," *Nuclear Instruments and Methods in Physics Research*, B37/38, pp. 224-230.
C. C. Fu, et al., "Elimination of mask-induced defects with vote-taking lithography", *SPIE Optical Microlithography V*, vol. 633, p. 270 (1986).
H. Kinoshita, K. Kurihara, "Soft x-ray reduction lithography using multilayer mirrors", *J. Vac. Sci. Technol.*, vol. B7 (6), Nov./Dec. (1989).

*Primary Examiner*—Marion E. McCamish
*Assistant Examiner*—S. Rosasco
*Attorney, Agent, or Firm*—George S. Indig

[57] ABSTRACT

Fabrication of reflective masks, designed for use with x-ray delineating radiation in the construction of submicron devices, is expedited by use of a barrier layer intermediate the multilayer reflector and the absorber layer. The barrier is designed to reduce damage to the multilayer reflector during two stages of fabrication—during initial patterning and during subtractive or additive mask repair. Composition of the barrier is so chosen as to minimize such damage during its removal in baring of the reflector, and also as to have requisite stability in regions retained during mask life.

10 Claims, 1 Drawing Sheet

MASK FOR X-RAY PATTERN DELINEATION

TECHNICAL FIELD

The invention relates to x-ray projection pattern delineation as used in the fabrication of devices using sub-micron design rules. It is concerned with design and fabrication of reflecting masks currently receiving attention for such use. In particular, it addresses patterning while minimizing damage to final reflecting regions presented in the mask.

DESCRIPTION OF THE PRIOR ART

It is expected that Large Scale Integrated circuits, presently at the 1 megabit chip level attained after decades of development, will continue to advance, to reach the 256 megabit level perhaps about the turn of the century. While it is likely advancement will, in part, take the form of increasing chip size from its present $\approx 1$ cm$^2$, it will heavily depend as well on reduction in design rule from the present $\approx 1$–$0.9$ $\mu$m.

It is recognized that resolution limitations will require replacement of presently used ultraviolet pattern delineation used in LSI fabrication. Wavelength limitation is expected to result in replacement of presently used near-UV ($\lambda \approx 365$ nm) by radiation in the deep-UV spectrum ($\lambda \approx 350$ nm to 150 nm). Deep-UV will, in turn, become wavelength limited, possibly at the 0.35 $\mu$m design rule level—likely corresponding with 64 megabit chip capacity.

Continued use of electromagnetic radiation for pattern delineation at smaller design rules will require x-ray. Relevant effort has been based on "soft x-ray"-on radiation of relatively low penetration within the broad wavelength range of $\lambda = 50$–$500$ Å. A narrower wavelength range of initial interest is likely to be $\lambda = 100$–$200$ Å. Work on projection x-ray lithography began in earnest about four years ago. (See, Hawryluk and Seppala, *J. Vac. Sci. Technol.*, vol. B6, p. 2162 (1988) and Silfvast and Wood, *Microelectronics Engineering*, vol. 8, p. 8 (1988).) There is general agreement that commercially operating systems will depend on reflective optics as well as reflection masks, in both instances, with the required 60+% reflectivities dependent upon multilayer reflectors ("MLR"). In some technologies this type of reflector, which depends upon constructive interference of periodic partial reflections, is referred to as a Distributed Bragg Reflector.

The complexity of the MLR structure as well as continuing miniaturization contributes to reduced device yield. Effort to offset this has been directed to fabrication of improved masks. In addition, such considerations have led to mask inspection and repair essentially for all masks at critical delineation levels in manufacture of state-of-the-art integrated circuits. While a variety of processing improvements will likely result in reduction in number of mask defects, there is little question but that critical masks will continue to undergo repair in the x-ray delineation era.

An alternative approach entails "voting". (See, C-C Fu, D. Dameron and A. McCarthy, *Proc. SPIE*, vol. 633, p. 270 (1986).) This procedure takes advantage of the statistical likelihood that the location of a mask defect will not repeat in fabrication of some number of identical masks. As usually contemplated, it is assumed that a set of three such masks will not include a recurring defect. The approach takes advantage of this statistical likelihood by patterning the device-in-fabrication by a succession of three masks rather than by one mask for a single level. In accordance with this approach, mask development and device fabrication conditions are prescribed to be tolerant of exposure variation—e.g. of one-third exposure intensity for regions of unwanted exposure, and of two-thirds exposure intensity for regions to be exposed.

While "voting" has reduced device loss due to mask defects, trebling of alignment/registration demands takes its toll.

Recent reported mask fabrication has depended upon patterning by removal of selected areas of the MLR. (See, H. Kinoshita, et al, *Proc. OSA*, vol. 12, p. 45 (1991).) An alternative approach leaves the MLR unaffected, and, instead, depends upon an overlying patterned absorber layer. (See, A. M. Hawryluk et al, *J. Vac. Sci. Tech.*, vol. B7, p. 1702 (1989).) In that work, blocking regions of the mask correspond with absorber regions remaining after patterning by liftoff. Patterning in this manner reveals free surface "pass" regions on the MLR. Use of liftoff, rather than the generally preferred dry etching, is to minimize damage to exposed MLR. Resolution limitation of liftoff patterning and defects due to debris have likely contributed to emphasis on MLR etch-patterning.

SUMMARY OF THE INVENTION

The invention concerns fabrication of reflecting masks to be used in x-ray pattern delineation—of masks generally based on MLR reflectivity. In general, x-ray patterning is considered of interest for fabrication of devices using design rules of 0.35 $\mu$m and smaller—perhaps to 0.1 $\mu$m and smaller, and the invention is so directed. Masks of the invention separate the absorption function from the reflection function of the MLR by use of an art-recognized absorber layer. Problems associated with this approach are avoided by use of a barrier layer interposed between the MLR and absorber layer. This barrier layer, e.g. constituted of an organic polymeric material such as a polyimide, serves a most significant function during mask fabrication; to assure protection of the underlying MRL surface. It serves this purpose at one or both of two stages—(1) during initial patterning of the absorber layer and (2) during repair of the now-patterned absorber layer. While it may be used with liftoff procedures, resistance to dry processing—e.g., reactive ion etching (RIE), plasma etching and, ion milling—permits use of these processes, generally considered preferable to liftoff. The same function dictates use with focused ion beam milling and deposition procedures—e.g. with ion beam-assisted deposition in mask repair.

Efficacy of the barrier layer concerns the final mask structure as well as processing expediency. While an important virtue concerns removability over MLR regions to be bared with avoidance of surface damage, an equally important virtue concerns retained regions. Fabrication in accordance with the invention unavoidably results in retention of barrier layer regions underlying retained absorber layer regions. Exemplary barrier materials—e.g. polyimides and hard-baked photoresists—are of sufficient durability to have little or no harmful effect on mask life.

Mask structures of the invention continue to profit from the separation of reflection and absorption functions as afforded by use of the overlying absorber layer. It is possible, too, to select barrier material to supplement the absorber function. Absorption of both polyimides and hard-baked photoresists suitable for protecting the MLR has been found to be consequential within the experimentally used 124–145 Å wavelength range. This, in turn, permits some thinning of the absorber layer.

BRIEF DESCRIPTION OF THE DRAWING

FIG. 1 is a perspective view of a mask blank prior to delineation.

FIG. 2 is the first of four perspective views depicting a mask in fabrication—here, the resist layer has been exposed and developed to reveal underlying absorber material.

FIG. 3 shows the stage at which the resist pattern has been transferred to the absorber layer.

In FIG. 4, defects in the absorber pattern have been corrected.

FIG. 5 depicts a portion of the final mask in which retained pattern detail consists of absorber together with underlying barrier.

DETAILED DESCRIPTION

General

While the matter discussed may be more generally applicable, primary concern is with Soft X-ray Projection Lithography. While initial work is likely to entail delineating radiation in the range, $\lambda = 124–145$ Å, the inventive processes are applicable over the broader range, $\lambda = 100–200$ Å—in fact over the entire range, $\lambda = 50–500$ Å. SXPL constitutes a prime candidate for LSI fabrication at design rules below those conveniently addressed by use of deep-UV. High absorption for contemplated soft x-ray has led to effort directed to reflecting rather than transmission masks. Use of thick substrates, so permitted, affords mechanical stability to, both, result in reliably smooth surfaces as constructed and to withstand distorting influences in use. Heat sinking, intrinsic to the substrate itself, tends to lessen likelihood of steep temperature gradients-a characteristic which may be supplemented, by cooling.

Recognition of these advantages has led to the work reported in the "Description of the Prior Art" section, culminating in a substrate-supported, multilayer MLR structure capped by an absorber layer. The present invention builds on that effort, most importantly, in provision of the barrier layer which, as described above, assures freedom from damage of bared MLR surface.

Mask Structure/Composition

Figure 1:
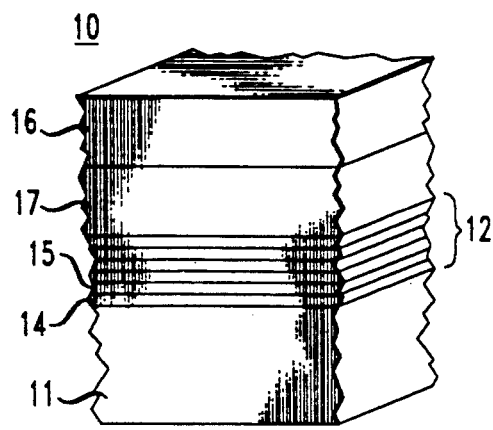
FIGS. 1 through 5 serve as basis for detailed description relating both to fabrication and layer composition. These figures depict a mask in the course of fabrication.

Reference is made to FIG. 1 in discussion of mask parameters. The essential functioning parts of the mask 10 as shown in FIG. 1, constitute substrate 11, multilayer (MLR) reflector 12 (in turn constituted of alternating layers of materials 14 and 15 of differing optical constants for contemplated radiation, together with overlying absorber layer 16. The thrust of the invention relies upon a barrier layer 17 intermediate absorber layer 16 and MLR 12. As discussed, while the critical value of barrier 17 concerns processing—permits attainment of substantially undamaged reflector surfaces together with high contrast reflector-absorber interfaces in the patterned mask-it is significant that unavoidable retention of barrier in blocking regions of the mask does not impair functioning.

Substrate 11

An advantage of reflective masks, as permitted in soft x-ray projection, is separation of optical functioning from physical/stability desiderata of the substrate—notably attainable smoothness, surface figure, thermal coefficient of expansion to match deposited material and to tolerate conditions in use. For a prime system described here, polished single crystal silicon wafers are appropriate—exhibit desired stability and thermal coefficient of expansion suitable to the molybdenum-silicon MLR used in the examples. Alternatives include low expansion glasses used for optical applications, silicon carbide, etc. Desired physical stability for a three inch wafer has been realized for thickness of $\approx 10$–90 mils. Greater thickness is no impediment except possibly in terms of space.

Silicon wafer technology is at a stage to enable attainment of useful surface smoothness. Smoothness values of from 10 Å to 5 Å height variation over the functioning mask are readily attainable.

Reflector 12

As with the substrate, construction of suitable multilayer structures is known. Relevant design parameters for layers 14 and 15 are individual layer thicknesses and optical constants. The MLR structure of the examples was based on a periodic multilayer stack consisting of forty layer pairs of molybdenum and silicon; in this instance of period of 68 Å of which the molybdenum layer made up 40%. Peak reflectivity was $\approx 65\%$ at $\lambda = 13$ nm. Relevant considerations as to parameters discussed for MLR design are set forth in T. W. Barbee, *Proc. SPIE*, ""Multilayers for X-ray Optics"", "Applications of Thin Film Multilayered Structures to Figured X-Ray Optics", G. Marshall, ed., vol. 563, p. 2 (1985).

Absorber 16

Initial studies made use of the gold absorber overlayer previously studied (A. M. Hawryluk, et al, *J. Vac. Sci. Technol.*, vol. B7, p. 1702 (1989)). Use of a 1,000 Å vapor deposited layer of elemental gold results in reflectance in the range of 0.002–0.004 over the 10–15 nm soft x-ray wavelength range. The reflectance ratio for this absorber relative to the described 40 pair bared Mo/Si MLR peaks at $\approx 100$ at $\lambda = 13$–13.4 nm. Processing considerations with regard to patterning thus far suggest some preference for use of absorber layers of elemental germanium. Reflectance values, and, consequently, reflectance ratio relative to the Mo/Si MLR for similar thicknesses are the same order of magnitude as for gold. Choice of absorber material is based on considerations discussed. It is likely choice will be for a metallic material, although other considerations may dictate otherwise. Reflectance ratios of $\approx 120$ at $\lambda = 13$ nm have been realized for chlorine-containing organic polymer material, e.g. for a 0.3 $\mu$m thick layer of a chlorinated acrylate electron beam resist material, e.g. Toray Industry, Inc.'s "EBR-9" Poly 2,2,2 trifluoroethyl alpha-chloro acrylate, conveniently used for patterning as well. Use of non-chlorinated polymers, even though of lower absorption, may be dictated by other considerations. Reasons for their choice include considerations such as physical and chemical stability, as well as improved resolution. Examples of suitable non-chlorinated polymers are PMMA (polymethyl methylacrylate), polyimides and conventional photoresists. Most hydrocarbon-based polymers are suitable for use as absorbers—even silicon-containing polymers with their somewhat reduced absorption may be chosen to suit etching conditions. Polymer materials may be rendered more stable both to chemical and thermal attack by cross linking.

Barrier

The thrust of the invention concerns this barrier layer. Separation of absorber and reflectance functions by use of the separate absorber layer has been recognized. Impairment of reflectivity of bared MLR and of remedies designed to minimize such impairment, have, as discussed, introduced problems. Barrier material is chosen to permit desired dry etch-patterning of absorber during mask construction. Superior pattern edge definition gains by avoidance of sloped edged configurations characteristic of liftoff. Liftoff, if otherwise acceptable, gains by use of the barrier layer, as well, since further reducing damage to the MLR (e.g. to the top molybdenum layer of the Mo/Si structure of the examples during repair). Choice of barrier material is critically dependent upon ease of removal subsequent to patterning of the absorber layer. A category of polymeric materials, the polyimides, has been removed by dry etching in oxygen with little degradation in reflectance of bared MLR. In one set of tests, oxygen etching using 500 volt ions for a period of six minutes, sufficient for polyimide removal degraded reflectivity from 60% to 57%. Reflectivity loss is further reduced at lower voltages and times. Increasing etch time—e.g. two hours at 200 volts—has produced acceptable imaging results.

Factors to be considered in choice of barrier have been discussed. At this time, satisfactory minimization of damage during dry etch removal in oxygen has been achieved by use of polyimides as well as by use of hard baked photoresists (e.g. novolac resin containing a dissolution inhibitor such as diazonaphthoquinone).

Mask Fabrication

Fabrication of mask structures is discussed with reference to FIGS. 2 through 5. For ease of discussion, number designations used in discussion of FIG. 1 are used throughout. As elsewhere in this discussion, description in terms of fabrication is intended to refer to mask repair as well. Repair, constituting either removal ("negative") or addition ("positive"), for the most part concerns repair of defects in the absorber, and is, accordingly, likely carried out before barrier removal—before initial baring of the reflector.

Resist Patterning

Figure 2:
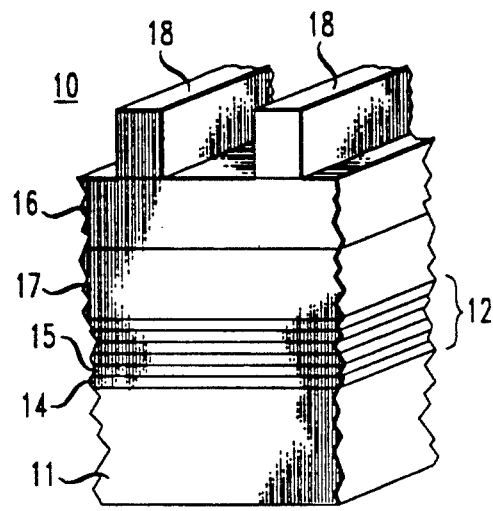

As depicted in FIG. 2, a layer of resist has been deposited on top of absorber layer 16, following which patterning has resulted in removal, to leave pattern etch features 18. Patterning is at this time likely by electron beam writing, or in some instances by use of mask (e.g. by accelerated electrons as in U.S. Pat. No. 5,079,112, issued Jan. 7, 1992). Alternatives include laser ablation, laser assisted etching, selective deposition, etc. In any event, the layer from which features 18 are produced may be a conventional electron beam resist-positive, e.g. polybutenesulfone, polymethyl methylacrylate, or negative, e.g. glycidol methacrylate-co-chlorostyrene, or a chemically amplified, acid-catalyzed novolac resin resist (e.g. RAY-PN, manufactured by Hoechst). Material removal may entail chemical development or direct volatilization. Simplest implementation may make use of a single layer resist. Multilayer resists may be substituted. Requirements are sufficient resolution and chemical stability to permit transfer of the pattern to the absorber layer 16.

Patterning of Absorber Layer

Figure 3:
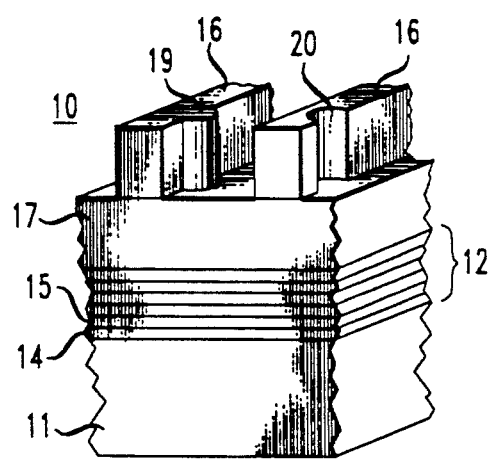

This stage in fabrication is shown in FIG. 3. As there depicted, resist features 18 have been removed leaving retained absorber 16. General desire for dry etch transfer requires formation of volatile compounds in situ. Germanium absorber material has been useful as exposed to appropriate plasma chemistry. Representative procedures are R eactive I on E tching, plasma etching, ion milling. (See, *Thin Film Processes*, part V-Z, J. L. Vossen and W. Kern, eds., Academic Press, New York, (1978).) For illustrative purposes, this figure shows defects in the form of protuberance 19 and indentation 20.

Figure 4:
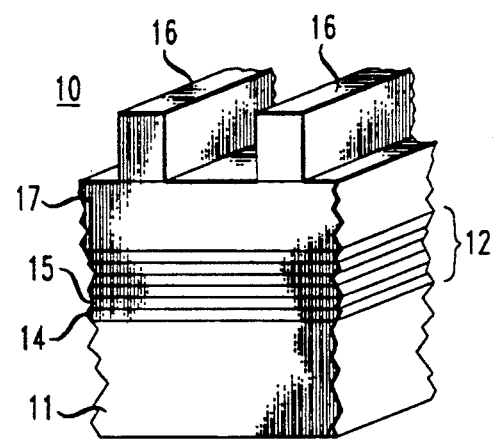

FIG. 4 shows the device in fabrication at the subsequent stage at which mask inspection has revealed defects 19 and 20, and these have been rectified by ion beam milling and deposition, respectively. As discussed, mask inspection/repair, particularly for design rules contemplated in this description, are likely carried out on a mask-by-mask basis, at least for critical mask levels including minimum dimensioned features. Details in repair, either negative, e.g. removal of protuberance 19, or positive, e.g. addition of material to fill unwanted voids such as depression 20, are well-known and do not constitute a necessary part of this description. (See, e.g. A. Wagner and P. Levin, *Nucl. Inst. Meth.*, vol. B37/38, p. 224 (1989); L. R. Harriott, *Nucl. Inst. Meth.*, vol. B55, p. 802 (1991; L. R. Harriott and M. J. Vasile, *J. Vac. Sci. Technol.*, vol. B6, p. 1035 (1988).)

Figure 5:
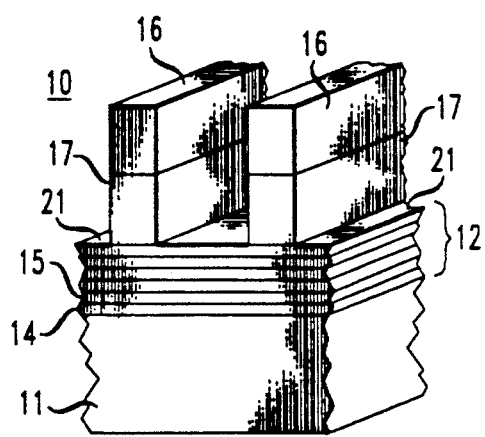

In FIG. 5 the image has been transferred to barrier layer 17 thereby baring surface regions 21 (in terms of the examples, baring the top molybdenum surface of the Mo/Si MLR). Removal of barrier material, as discussed, is by procedure chosen to avoid damage to the MLR. The structure as shown in FIG. 5 is that of a portion of a final mask.

Description has been in terms of essential mask layers. Additional material, e.g. to protect against atmospheric and other agents to be encountered, may be incorporated. Discussion has been in the simplest terms—a number of variations are possible. For example, while dry etching is generally preferred, liftoff, or even wet etching may be tolerated, particularly for less critical mask levels. Accordingly, detailed description, largely in terms of such essential mask layers, should be interpreted accordingly. As an example, discussion in terms of baring, e.g. of absorber, should not be interpreted as requiring direct baring-may entail initial baring of an intermediate layer to ultimately result in the stated objective of baring the absorber itself.

EXAMPLES

The numbered examples presented are chosen from a larger number serving as basis for numerically defined parameters, and other variations of particular consequence, in the above description. For comparison purposes, examples all relate to certain standardized design terms. All used single crystal silicon substrates and MLR structures constituted of 40 layer pairs (or periods) of Mo/Si of layer thicknesses tuned for use with 13.9 nm wavelength delineating radiation. The chosen examples are all based on use of an elemental germanium absorber layer. In all instances, initial delineation of the resist was by direct write e-beam lithography, and included deliberately-introduced defects, e.g. protuberance 19 requiring negative repair and recess 20 requiring positive repair. Repair in both instances was by means of suitably equipped focused ion beam (FIB).

Examples 1, 2 and 3 entailed negative or "subtractive" repair. Examples 4, 5 and 6 entailed positive or "additive" repair. Examples 1, 3, 4 and 6 are directed to construction of "dark field" masks in which use of positive resist material resulted in revealing of exposed regions of the MLR so that they defined "pass" or reflecting regions of the final mask. The additional example of each of the sets, examples 2 and 5, are based on use of an additional blocking layer—in this instance a NiCr alloy layer—for tone reversal. Examples 2 and 5 thereby represent tone reversal to result in "light field" masks in which exposed regions define "blocking" or absorbing regions of the final mask.

Fabrication of the dark field masks of examples 1 and 4 and of the light field masks of examples 2 and 5 employed a polyimide barrier layer beneath the germanium absorber layer. Examples 3 and 6 used a barrier of "hard baked" (cured, i.e. cross-linked) novolac photoresist. The germanium absorber layer in the fabrication of dark field masks of examples 1, 3, 4 and 6 were patterned using a single layer of PMMA to yield a pattern which served as reactive ion etch mask for the 0.1 $\mu$m thick germanium absorber. Tone reversal in examples 2 and 5 was achieved by use of a two layer PMMA resist system permitting liftoff of the 20 nm thick NiCr film. Following use as etch mask for the germanium absorber, retained NiCr became a permanent portion of the absorber structure. While this approach permitted more direct comparison as between tones, it is expected commercial usage will take the form of use of single resist layers—in one instance, positive; in the other, negative.

Etching of the germanium absorber was based on reactive ion etching using a parallel plate system. Uniform conditions depended on $CF_3Br$ at a pressure of 10 millitorr and flow rate of 20 sccm under conditions yielding a measured dc bias of 100 volts.

Repair of programmed defects was performed with a focused ion beam system in vacuum by ion milling, using a gallium ion beam for subtractive repairs and ion-assisted deposition for additive repairs. Additive repairs were based on use of a gas jet of phenylacetylene yielding gallium carbide. Subtractive repair on dark field masks used an ion dose of $7.5 \times 10^{16}$ ions/cm$^2$. Subtractive repair on light field masks used an ion dose of $1.5 \times 10^{17}$ ions/cm$^2$. (The additional dosage was needed to remove the NiCr layer.) Additive repair required a dose of $5 \times 10^{17}$ ions/cm$^2$ for both mask tones. There was no change in dose for the different barriers.

Bared barrier regions in all instances were removed by RIE in oxygen at 10 millitorr using a flow rate of 20 SCCM with a measured bias of 200 volts.

Data yielded by the six examples, together with other experimental data, served as basis for the description. In no instance was MLR reflectivity damage sufficient to require adjustment of exposure time. There was no meaningful variation in reflectivity as between initially delineated and repaired regions. Repair efficacy was otherwise evaluated by scanning electron microscopy. In all instances, repair was effective.

The order of numbered examples as discussed above is, for convenience, set forth in tabular form.

| Example Number | FIB Repair Type | Barrier Material | Mask Tone |
| --- | --- | --- | --- |
| 1 | Subtractive | Polyimide | Dark Field |
| 2 | Subtractive | Polyimide | Light Field |
| 3 | Subtractive | Hard Baked Photoresist | Dark Field |
| 4 | Additive | Polyimide | Dark Field |
| 5 | Additive | Polyimide | Light Field |
| 6 | Additive | Hard Baked Photoresist | Dark Field |

I claim:

1. Fabrication of a reflecting mask for use with delineating radiation in the x-ray spectrum entailing (a) construction of a multilayer reflector, bared regions of such reflector yielding "pass regions" of such mask, (b) construction of a patterned absorber layer, patterned regions defining "blocking regions" of such mask, characterized in that there is a barrier layer intermediate such absorber layer and such multilayer reflector during fabrication including patterning of the said absorber layer, said barrier layer protecting the multilayer reflector during patterning of the absorber layer, and (c) said barrier layer being patterned to, in turn, reveal bared multilayer reflector.

2. Fabrication of claim 1 in which patterning of the absorber layer entails a patterned resist layer overlying said absorber layer.

3. Fabrication of claim 1 in which the absorber layer is patterned by direct patterning.

4. Fabrication of claim 1 entailing inspection following patterning of the said absorber layer, and, if needed, repair.

5. Fabrication of claim 4 in which inspection is a regular part of the said process, being carried out at at least one stage in the fabrication of each mask.

6. Fabrication of claim 5 in which mask repair entails dry processing.

7. Fabrication of claim 6 in which such dry processing comprises exposure of mask defects to accelerated ions.

8. Fabrication of claim 7 in which repair is negative and consists essentially of ion milling.

9. Fabrication of claim 7 in which repair is positive and consists essentially of ion deposition.

10. Mask produced in accordance with the fabrication of any one of claims 1 through 9.

* * * * *